United States Patent [19]

Aoki et al.

[11] Patent Number: 5,576,969
[45] Date of Patent: Nov. 19, 1996

[54] IC COMPRISING FUNCTIONAL BLOCKS FOR WHICH A MASK PATTERN IS PATTERNED ACCORDING TO CONNECTION AND PLACEMENT DATA

[75] Inventors: Yasushi Aoki; Minoru Kayano; Kousuke Uno, all of Tokyo, Japan

[73] Assignee: NEC Corporation, Tokyo, Japan

[21] Appl. No.: 207,663

[22] Filed: Mar. 9, 1994

[30] Foreign Application Priority Data

Mar. 9, 1993 [JP] Japan .................................. 5-047630

[51] Int. Cl.⁶ .................................................. G06F 17/10
[52] U.S. Cl. ................................ 364/491; 364/488/490
[58] Field of Search .................................. 364/488, 489, 364/490, 491; 257/206, 208, 211; 307/303.1

[56] References Cited

U.S. PATENT DOCUMENTS

| | | | |
|---|---|---|---|
| 4,093,990 | 6/1978 | Koller et al. | 364/491 |
| 4,613,941 | 9/1986 | Smith et al. | 364/490 |
| 4,636,965 | 1/1987 | Smith et al. | 364/491 |
| 4,811,237 | 3/1989 | Putatunda et al. | 364/491 |
| 4,839,821 | 6/1989 | Murakata | 364/491 |
| 4,890,238 | 12/1989 | Klein et al. | 364/491 |
| 4,910,574 | 3/1990 | Aipperspach et al. | 357/40 |
| 4,918,614 | 4/1990 | Modarres | 364/490 |
| 5,084,824 | 1/1992 | Lam et al. | 364/488 |
| 5,173,864 | 12/1992 | Watanabe et al. | 364/491 |
| 5,191,542 | 3/1993 | Murofushi | 364/491 |
| 5,247,456 | 9/1993 | Ohe et al. | 364/488 |
| 5,311,443 | 8/1994 | Crain et al. | 364/491 |
| 5,313,079 | 5/1994 | Brasen et al. | 257/206 |
| 5,363,313 | 11/1994 | Lee | 364/491 |
| 5,388,054 | 2/1995 | Tokumaru | 364/490 |
| 5,422,317 | 6/1995 | Hua et al. | 364/488 |

OTHER PUBLICATIONS

"LSI Handobukku " (LSI Handbook), Item 3.2 Reiauto Sekkei (Layout Design), Edited by the Institute of Electronics and Electric Communication Engineers of Japan, Published 1959 by Oomu–Sya, Japan, pp. 201–210.

*Primary Examiner*—Kevin J. Teska
*Assistant Examiner*—Tyrone V. Walker
*Attorney, Agent, or Firm*—Foley & Lardner

[57] ABSTRACT

For functional blocks of an IC, each functional block comprising a plurality of macroblocks, each macroblock comprising a plurality of basic cells, a mask pattern is patterned in accordance with a layout design by using its connection data of the macroblocks in each functional block and its placement data of the basic cells in each functional block. Use of the placement data in addition to the connection data makes it possible to regularly and systematically arrange the basic cells in each functional block to achieve shortest possible connections in each fundamental block and a narrowest possible area of each functional block. In order to put a CPU in operation of patterning the mask pattern, an operating system comprises for read by the CPU first and second memories loaded with the connection and the placement data, respectively.

4 Claims, 3 Drawing Sheets

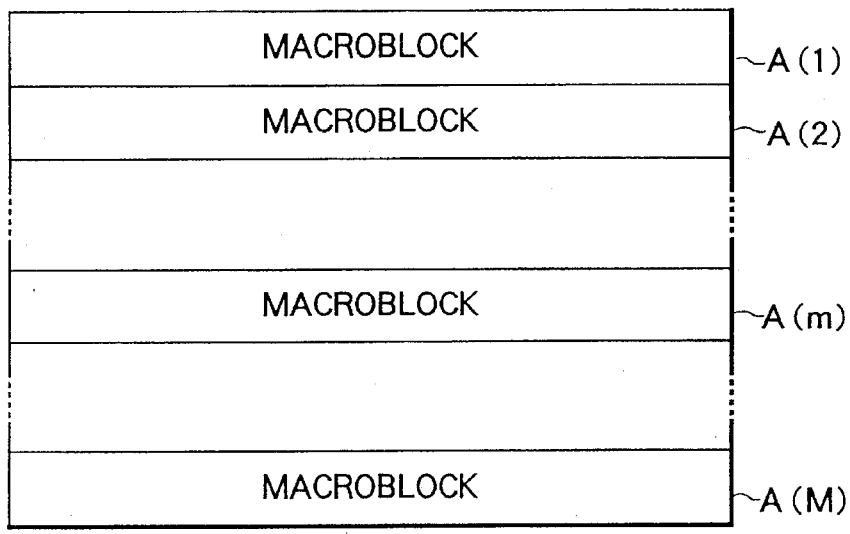
FIG. 1
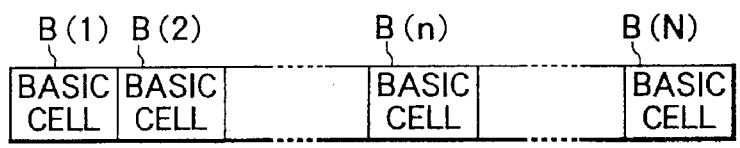
FIG. 2
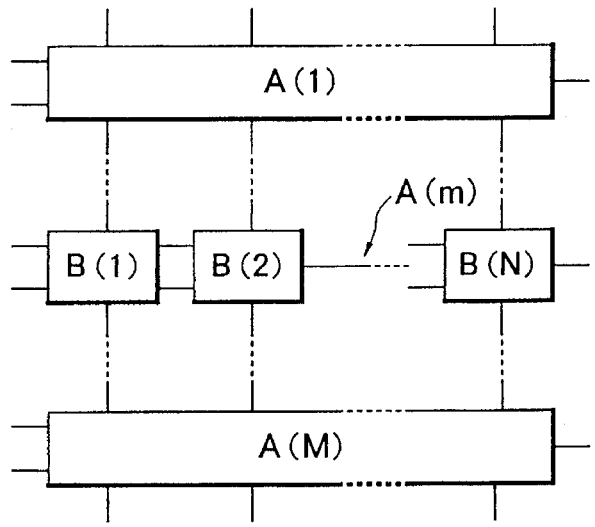
FIG. 3
FIG. 4
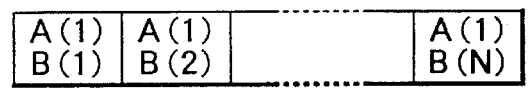

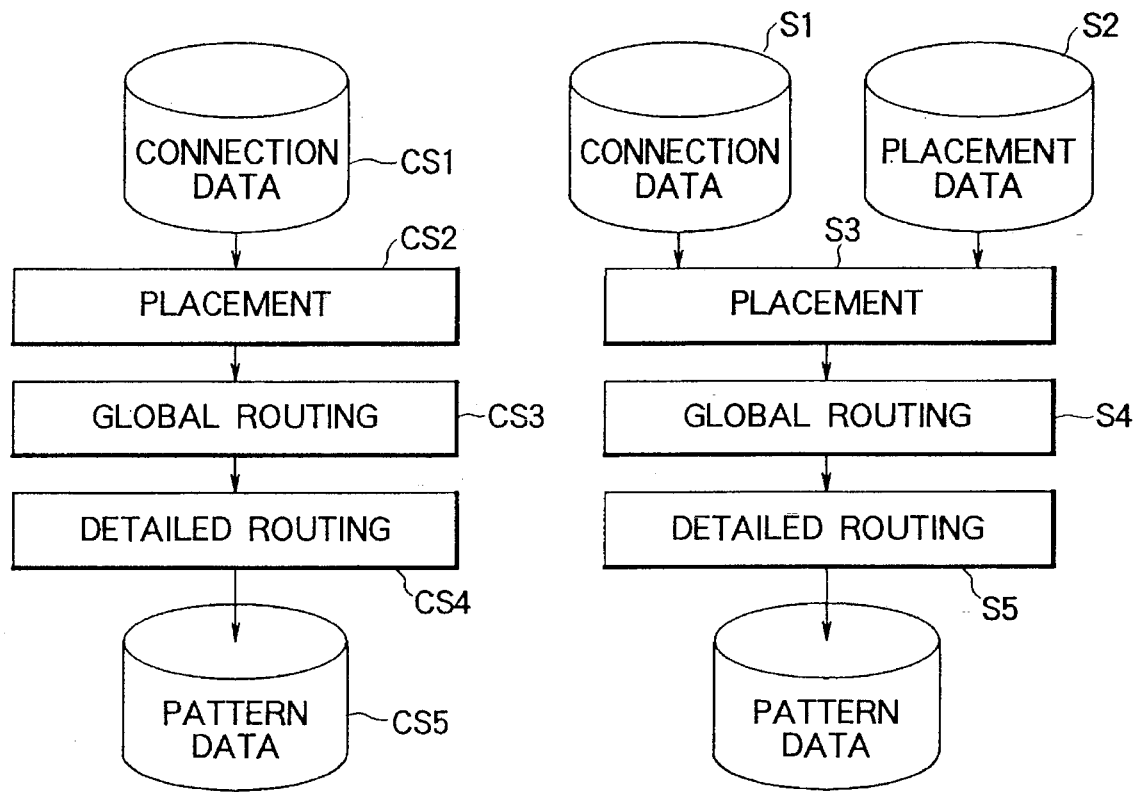
Prior Art
FIG. 5
FIG. 6
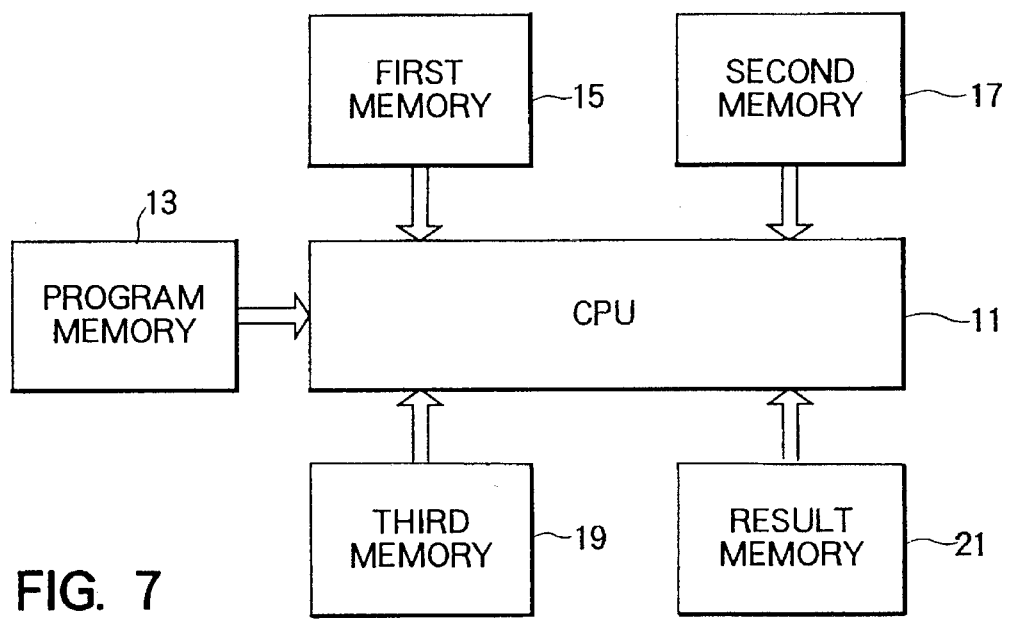
FIG. 7

A(1)B(1), A(1)B(2), A(1)B(3), A(1)B(4), A(1)B(5), A(1)B(6), A(1)B(7), A(1)B(8),
A(2)B(1), A(2)B(2), A(2)B(3), A(2)B(4), A(2)B(5), A(2)B(6), A(2)B(7), A(2)B(8),
A(3)B(1), A(3)B(2), A(3)B(3), A(3)B(4), A(3)B(5), A(3)B(6), A(3)B(7), A(3)B(8),
A(4)B(1), A(4)B(2), A(4)B(3), A(4)B(4), A(4)B(5), A(4)B(6), A(4)B(7), A(4)B(8),
A(5)B(1), A(5)B(2), A(5)B(3), A(5)B(4), A(5)B(5), A(5)B(6), A(5)B(7), A(5)B(8),
A(6)B(1), A(6)B(2), A(6)B(3), A(6)B(4), A(6)B(5), A(6)B(6), A(6)B(7), A(6)B(8),

IC COMPRISING FUNCTIONAL BLOCKS FOR WHICH A MASK PATTERN IS PATTERNED ACCORDING TO CONNECTION AND PLACEMENT DATA

BACKGROUND OF THE INVENTION

This invention relates to a semiconductor integrated circuit (IC) comprising polycell functional blocks for which a mask pattern is patterned in accordance with a layout design by an automatic placement and routing digital computer. This invention relates furthermore to an operating system for such a digital computer.

In the integrated circuit, the functional blocks are integrated typically employing gate array large-scale integration (LSI) and/or standard cell large-scale integration. It will later be exemplified that each functional block comprises a plurality of macroblocks and that each macroblock comprises a plurality of rectangular basic cells having a substantially common height.

In the manner which will later be described more in detail, the mask pattern has conventionally been given a pattern based only on connection data of connection of the macroblocks in each of the functional blocks. By reading the connection data, a conventional automatic placement and routing digital computer has produced pattern data of the mask pattern by three successive stages of placement, global routing, and detailed routing. During the placement, constructive initial placement is combined with iterative improvement. Such placement, global routing, and detailed routing are described in various references as, for example, in a handbook called "LSI Handobukku" (LSI Handbook) edited by the Institute of Electronics and Electric Communication Engineers of Japan and published in 1959 by Oomu-sya (transliterated in accordance with ISO 3602), under Item 3.2 "Reiauto Sekkei" (Layout Design).

Inasmuch as only the connection data are used, the present inventors have found it difficult to achieve optimized placement of the basic cells in each of the macroblocks by the constructive initial placement and the iterative improvement. In other words, it has been difficult to produce an optimum mask pattern by attaining shortest possible connections for the basic cells of the functional blocks and best possible electric characteristics of the functional blocks, such as a highest possible operation speed and a small power consumption. In particular, these drawbacks are unavoidable when the integrated circuit comprises a bit-sliced structure, such as an arithmetic and logical unit (ALU) and/or a multiplier.

SUMMARY OF THE INVENTION

It is consequently a principal object of the present invention to provide a semiconductor integrated circuit comprising polycell fundamental blocks for which a mask pattern is patterned in accordance with a layout design to make each functional block comprise a plurality of macroblocks, each macroblock comprising a plurality of basic cells having a substantially common height.

It is another principle object of this invention to provide an integrated circuit which is of the type described and for which the mask pattern is optimized to achieve shortest possible connections for the basic cells of the functional blocks and best possible electric characteristics of the functional blocks.

It is a subordinate object of this invention to provide an integrated circuit which is of the type described and which comprises a bit-sliced structure.

It is another object of this invention to provide an operating system for a digital computer used in patterning a mask pattern for use in manufacturing the functional blocks of the integrated circuit of the type described.

According to an aspect of this invention, there is provided a semiconductor integrated circuit comprising polycell functional blocks for which a mask pattern is patterned by an automatic placement and routing digital computer in accordance with a layout design to make each functional block comprise a plurality of macroblocks, each macroblock comprising a plurality of basic cells having a substantially common height, wherein the mask pattern is given a pattern based on connection data of connection of the macroblocks in each of the functional blocks and on placement data of placement of the basic cells in each of the functional blocks in correspondence to the connection data.

According to another aspect of this invention, there is provided an operating system for putting a digital computer in operation for patterning a mask pattern used in manufacturing polycell functional blocks of a semiconductor integrated circuit, each functional block comprising a plurality of macroblocks, each macroblock comprising a plurality of basic cells having a substantially common height, wherein the operating system comprises a first memory loaded with connection data of connection of the macroblocks in each of the functional blocks and read by the digital computer and a second memory loaded with placement data of placement of the basic cells in each of the functional blocks in correspondence to the connection data and read by the digital computer.

BRIEF DESCRIPTION OF THE DRAWING

FIG. 1 is a schematic top view of a functional block comprising a plurality of macroblocks in a general semiconductor integrated circuit;

FIG. 2 is a schematic top view of a plurality of basic cells in one of the macroblocks illustrated in FIG. 1;

FIG. 3 schematically shows connection data of connection of the macroblocks depicted in FIG. 1 and of the basic cells in one of the macroblocks;

FIG. 4 schematically shows placement data of placement of the basic cells in the functional block depicted in FIG. 1;

FIG. 5 is a flow chart of operation of a conventional layout system for patterning a mask pattern used in manufacturing functional blocks of the type illustrated in FIG. 1;

FIG. 6 shows a flow chart of operation of a layout system according to an embodiment of the instant invention;

FIG. 7 is a block diagram of a digital computer and an operating system which are used as the layout system mentioned in conjunction with FIG. 6;

DESCRIPTION OF PREFERRED EMBODIMENT

Figures 8, 9:
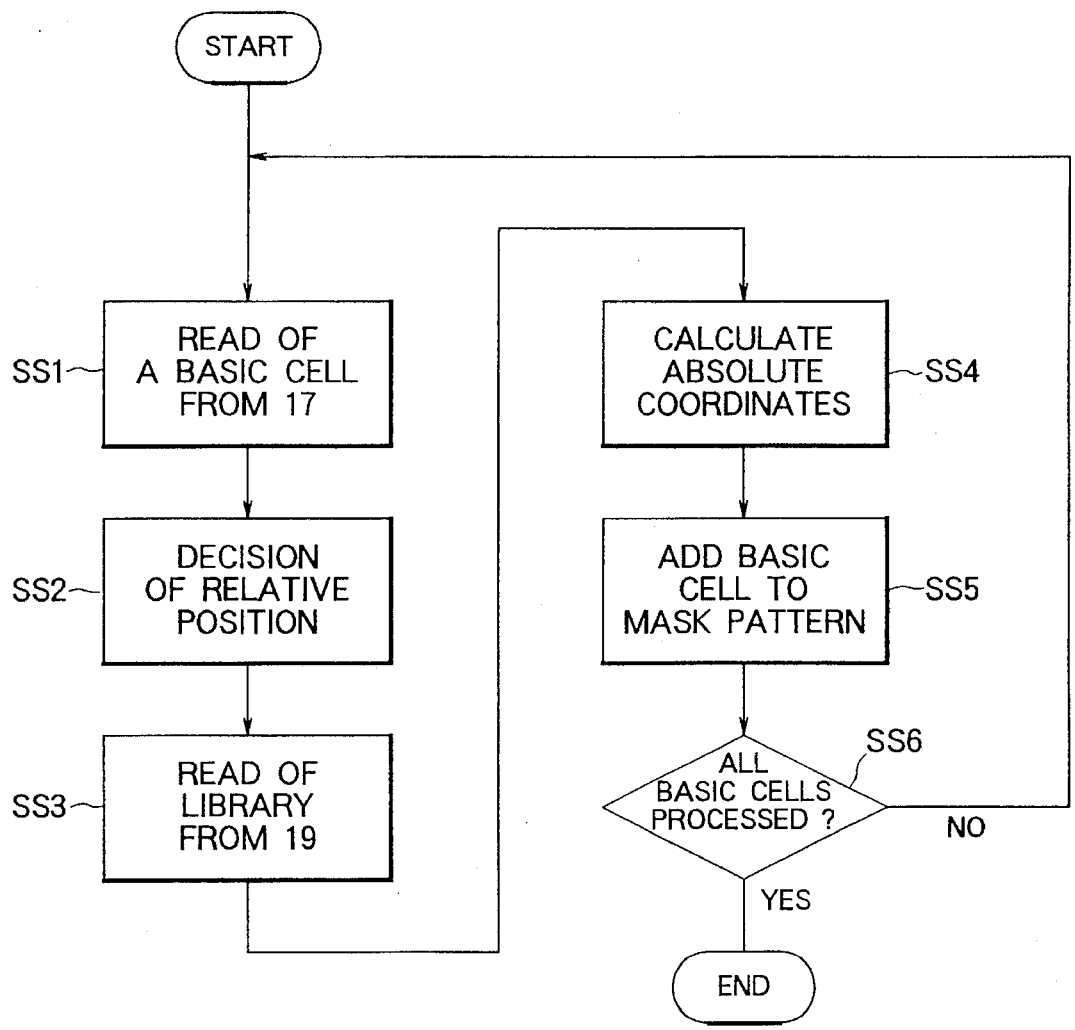
FIG. 8 shows an example of placement data stored in a memory of the operating system depicted in FIG. 7.
FIG. 9 shows a detailed flow chart of operation of the layout system mentioned in connection with FIG. 6.

Referring to FIG. 1, it may first be mentioned that a semiconductor integrated circuit comprises polycell functional blocks in general and that each of the functional blocks comprises a plurality of macroblocks. In the integrated circuit, the functional blocks are integrated typically employing gate array large-scale integration and/or standard cell large-scale integration. In the example being illustrated, one of the macroblocks has a bit-sliced structure and comprises first through M-th macroblocks A(1) to A(M) of a common bit width of one bit, where M represents a first integer dependent on the functional blocks. In other words, the macroblocks A (suffixes omitted) may either be identical with each other or be different. An m-th macroblock A(m) is depicted as a representative of the macroblocks A, where m is variable between 1 and M, both inclusive.

Turning to FIG. 2, each macroblock comprises a plurality of rectangular basic cells having a substantially common height and various widths. The m-th macroblock A(m) comprises first through N-th basic cells B(1) to B(N), where N represents a second integer which depends on the macroblocks and on the functional blocks and may or may not be equal to the first integer. It should be noted that the basic cells B (suffixes omitted) are depicted merely for convenience of illustration to have an approximately common width. One of the basic cells B is shown as an n-th basic cell B(n), where n is variable between 1 and N, both inclusive. Such a basic cell B(n) may be either an AND gate or a NOR gate.

Referring to FIG. 3, the macroblocks A and the basic cells B have input and output terminals depicted by lines extended outwardly thereof. In the functional block being illustrated, the input and the output terminals are connected as shown. FIG. 3 therefore represents connection data of connection of the macroblocks A in each of the functional blocks and like connection data of connection of the basic cells B in each of the macroblocks A.

Turning to FIG. 4 with FIGS. 1 and 2 again referred to, the macroblocks and the basic cells, such as A and B, of the functional blocks are manufactured on a semiconductor chip or substrate by using a mask pattern. In FIG. 4, the first macroblock A(1) is composed of first through N-th basic cells A(1)B(1), A(1)B(2), . . . , and A(1)B(N). Other basic cells are similarly designated. In each functional block, the first through the M-th macroblocks A are arranged on the mask pattern successively from top to bottom of the figure. In each macroblock, the first through the N-th basic cells B are placed on the mask pattern from left to right. FIG. 4 therefore represents placement data of placement of the basic cells B in each of the functional blocks.

Referring to FIG. 5, a conventional automatic placement and routing digital computer is operable as follows to pattern a mask pattern in accordance with a layout design in polycell functional blocks of a semiconductor integrated circuit. Each of the functional blocks comprises a plurality of macroblocks A in the manner illustrated in the foregoing with reference to FIG. 1. Each of the macroblocks A comprises a plurality of basic cells B as described with reference to FIG. 2. The macroblocks A and the basic cells B are connected into each of the functional blocks in accordance with the connection data exemplified in conjunction with FIG. 3. The digital computer will presently be illustrated together with a connection data memory and a result memory.

Preliminarily stored in the connection data memory, the connection data are read at a first conventional step CS1 and are used in the following steps to provide pattern data of a mask pattern for storage in the result memory. More particularly, the digital computer carries out at a second conventional step CS2 the placement in the manner described heretobefore. At a third conventional step CS3, the digital computer deals with the global routing mentioned hereinabove. At a fourth conventional step CS4, the digital computer processes the detailed routing to produce as result data the pattern data. At a fifth conventional step CS5, the result data are stored in the result memory.

Turning to FIG. 6, the digital computer is operable according to an embodiment of the present invention in the manner which will be described in detail in the following. The digital computer additionally comprises a placement data memory which will shortly be described and in which preliminarily stored are the placement data, exemplified in connection with FIG. 4, of placement or arrangement of the basic cells B in each of the functional blocks.

The digital computer reads at a first step S1 the connection data from the connection data memory and at a second step S2 the placement data from the placement data memory. Based on the connection data and the placement data, the digital computer produces pattern data in the manner detailed in the following. Broadly describing, the digital computer deals with the placement at a third step S3, the global routing at a fourth step S4, and the detailed routing at a fifth step S5 to produce the pattern data as the result data. At a sixth step S6, the result data are stored in the result memory.

Referring to FIG. 7, an automatic placement and routing digital computer is provided for dealing with patterning of the mask patterns by producing pattern data of the mask pattern in the manner illustrated broadly with reference to FIG. 6. The digital computer comprises a central processing unit (CPU) 11 and a program memory 13. In the manner known in the art, the program memory 13 is loaded with a program for keeping the central processing unit 11 in operation. The central processing unit 11 reads the program step by step.

The central processing unit 11 and the program memory 13 are herein collectively referred to afresh as a digital computer and are accompanied by an operating system for the digital computer (11, 13) in the manner which will be described in the following. It should be noted in this connection that the central processing unit 11 need not be used adjacent to the operating system but may be that of a general purpose computer located remote from the operating system provided that the program is adapted in the program memory 13 to operate the operating system.

The operating system comprises first and second memories 15 and 17. The first memory 15 is the connection data memory described in conjunction with FIG. 5. The second memory 17 is the placement data memory described in connection with FIG. 6. In addition, the operating system comprises third and fourth memories 19 and 21. The third memory 19 is called a library in the art and is preliminarily loaded with heights of the macroblocks, such as A, and widths of the basic cells, such as B, of the functional blocks of the integrated circuit. The fourth memory 21 will soon be described. During execution of the three successive stages of placement, global routing, and detailed routing, the central processing unit 11 refers to the first through the fourth memories 15 to 21 in accordance with the program stored in the program memory 13 with regard to the three successive stages.

The fourth memory 21 is an intermediate and final result memory in which the central processing unit 11 stores intermediate results of execution of the three successive stages and eventually the pattern data as a final result. The first through the fourth memories 15 to 21 need not be separate memory devices but are in practice four regions to which a disk memory is assigned. For execution of the three successive stages, a specific program is stored in the program memory 13. Incidentally, omitted from illustration are usual peripheral devices which comprise a main memory used as a working area, an input device, such as a keyboard, an output device, such as a printer, and a display device for use in watching progress of the three successive stages.

Turning to FIG. 8 with reference to FIG. 6 continued, the placement data are stored as a placement file in the second memory 17. In the example being illustrated in connection with one of the functional blocks, the file indicates the placement data depicted in FIG. 4 with the first integer M assumed to be equal to six and with the second integer N assumed as equal to eight throughout the macroblocks A of the functional block under consideration.

The file indicates the basic cells by A(1)B(1), A(1)B(2), ..., and A(1)B(8) for the first macroblock A(1). Similarly, the file indicates A(6)B(1), A(6)B(2), ..., and A(6)B(8) for the sixth macroblock A(6) which is the M-th macroblock A(M) in the example being illustrated.

In the placement file, two adjacent ones of the macroblocks A are segmented by a line renewal code which is not depicted herein as is the case with a new writing line mark "printed out" by a wordprocessor. In each of the macroblocks A, two adjacent ones of the basic cells B are segmented by a comma (,).

Referring now to FIG. 9 and again to FIG. 7, the three successive stages are executed as follows in accordance with the program stored therefor in the program memory 13. It will be presumed that the placement file is stored in the second memory 17 in the manner exemplified with reference to FIG. 8. After start of execution of the three successive stages, the central processing unit 11 reads at a first detailed step SS1 one of the basic cells B of a current macroblock of the macroblocks of a current functional block as a read cell from the second memory 17.

Referring to the file, the central processing unit 11 judges whether the read cell is preceded by a comma or by a line renewal code from another of the basic cells that immediately precedes the read cell in the file as a preceding cell. If preceded by the comma, the read cell should have an intrablock relative position to the right of the preceding cell in the current macroblock. If preceded by the line renewal code, the read cell should have an interblock relative position leftmost of the current macroblock. If preceded by neither the comma nor the line renewal code, the read cell should have a relative position topmost and leftmost in the current functional block. In this manner, the central processing unit 11 decides such a relative position of the read cell at a second detailed step SS2.

Subsequently, the central processing unit 11 reads at a third detailed step SS3 the third memory 19 to know as a first intermediate result the width of the read cell and the height of a preceding macroblock placed immediately topwardly of the current macroblock in the current functional block if the relative position indicates that the read cell of the current macroblock is in a row placed immediately bottomwardly of the preceding macroblock. At a fourth detailed step SS4, the central processing unit 11 uses the first intermediate result in calculating absolute coordinates of the read cell in the integrated circuit as a second intermediate result. Such absolute coordinates are defined by a coordinate system predetermined with regard to the integrated circuit and consequently to the current functional block.

In the manner described in connection with FIG. 6, the central processing unit 11 reads the connection data from the first memory 15 as regards the read cell and decides as a third intermediate result the global and the detailed routings of the read cell to and from others of the basic cells B in the current and the preceding macroblocks. The central processing unit 11 stores the second and the third intermediate results in the fourth memory 21.

At a fifth detailed step SS5, the central processing unit 11 refers to the fourth memory 21 to add the read cell in the pattern data. At a sixth detailed step SS6, the central processing unit 11 checks whether or not the read cell is a last cell of the current functional block, namely, the N-th basic cell B(N) of the M-th macroblock A(M). If YES, execution of the three successive stage comes to an end insofar as the current functional block is concerned. The central processing unit 21 is subsequently put into operation for another functional block of the integrated circuit. If NO, the sixth detailed step returns to the first detailed step. When all functional blocks are dealt with, the mask pattern is completely patterned.

In the integrated circuit, at least one of the functional blocks may have the bit-sliced structure mentioned hereinabove. According to the bit-sliced structure, at least a predetermined number of the macroblocks comprise basic cells of a common bit width of a plurality of bits, such as four bits, with these basic cells regularly and systematically arranged in the macroblocks under consideration from top to bottom. This invention therefore enables the functional blocks of the bit-sliced structure have best possible electric characteristics and a narrowest possible area with the basic cells placed in accordance with regular and systematic placement data.

Reviewing FIGS. 1 through 4 and 6 through 9, it is now clearly appreciated that this invention makes it possible for semiconductor integrated circuits to provide a mask pattern for regularly and systematically arranging the basic cells, such as B, in each functional block of each of the integrated circuits. As a consequence, the mask pattern can achieve shortest possible connections among the basic cells of each functional block and a narrowest possible area of each functional block. This makes it possible to attain best possible electric characteristics of the functional blocks.

While this invention has thus far been described in specific conjunction with a preferred embodiment thereof, it will now be readily possible for one skilled in the art to put this invention into practice in various other manners. For example, each of the functional blocks of a semiconductor integrated circuit and the basic cells of the functional blocks may not be rectangular but may be a parallelogram in outline. In this event, the coordinate system may be an oblique system, rather than a rectangular one, provided that the functional blocks are arranged parallel in the integrated circuit.

What is claimed is:

1. A semiconductor integrated circuit, comprising:
    polycell functional blocks for which a mask pattern is patterned by an automatic placement and routing digital computer in accordance with a layout design,
        each polycell functional block comprising a plurality of macroblocks,
        each macroblock comprising a plurality of basic cells having a substantially common height,
        said mask pattern being determined based on connection data of said macroblocks in each of said functional blocks and based on placement data of said basic cells in each of said functional blocks corresponding to said connection data, wherein said placement data includes a physical arrangement of each of said basic cells relative to other of said basic cells and a physical arrangement of said macroblocks relative to each other, wherein each of said basic cells is rectangular in shape, wherein at least one of said functional blocks has a bit-sliced structure in which at least a predetermined number of said macroblocks comprise a plurality of basic cells, each of said basic cells having a common bit width of a plurality of bits and each being placed throughout said macroblocks of said at least one of said functional blocks, in accordance with common placement data, and wherein said common placement data is used to configure said at least one of said functional blocks to achieve a narrowest allowable connection distance among said basic cells and a narrowest allowable layout area of said at least one of said functional blocks.

2. A semiconductor integrated circuit, comprising:

polycell functional blocks for which a mask pattern is patterned by an automatic placement and routing digital computer in accordance with a layout design, each polycell functional block comprising a plurality of macroblocks, each macroblock comprising a plurality of basic cells having a substantially common height, said mask pattern being determined based on connection data of said macroblocks in each of said functional blocks and based on placement data of said basic cells in each of said functional blocks corresponding to said connection data, wherein said placement data includes a physical arrangement of each of said basic cells relative to other of said basic cells and a physical arrangement of said macroblocks relative to each other, and wherein in said placement data, said macroblocks adjacent to each other are segmented by a line renewal code, and in each of said macroblocks, said basic cells adjacent to each other are segmented by a comma.

3. A computer-controlled apparatus for generating a mask pattern used in manufacturing polycell functional blocks of a semiconductor integrated circuit, each polycell functional block comprising a plurality of macroblocks, each macroblock comprising a plurality of basic cells having a substantially common height, said apparatus comprising:

a first memory for storing connection data of said macroblocks in each of said functional blocks, and a second memory for storing placement data of said basic cells in each of said functional blocks corresponding to said connection data, wherein said placement data includes a physical arrangement of each of said basic cells relative to other of said basic cells and a physical arrangement of said macroblocks relative to each other, and wherein in said placement data, said macroblocks adjacent to each other are segmented by a line renewal code and in each of said macroblocks, said basic cells adjacent to each other are segmented by a comma.

4. A computer-controlled apparatus for generating a mask pattern used in manufacturing polycell functional blocks of a semiconductor integrated circuit, each polycell functional block comprising a plurality of macroblocks, each macroblock comprising a plurality of basic cells having a substantially common height, said apparatus comprising:

a first memory for storing connection data of said macroblocks in each of said functional blocks, and a second memory for storing placement data of said basic cells in each of said functional blocks corresponding to said connection data, wherein said placement data includes a physical arrangement of each of said basic cells relative to other of said basic cells and a physical arrangement of said macroblocks relative to each other, and wherein when a currently read basic cell in one of said macroblocks is determined to be preceded by a comma in said placement data, said currently read basic cell is determined to be positioned adjacent to and in a rightward direction with respect to a most previously read basic cell in said one of said macroblocks, and when said currently read basic cell is determined to be preceded by a line renewal code in said placement data, said currently read basic cell is determined to be positioned at a leftmost position and directly below a most previously read macrocell.

\* \* \* \* \*